(12) United States Patent
Smith

(10) Patent No.: US 11,336,119 B2
(45) Date of Patent: May 17, 2022

(54) Q-FACTOR DETERMINATION OF COIL SELECT

(71) Applicant: Renesas Electronics America Inc., Milpitas, CA (US)

(72) Inventor: Nicholaus Wayne Smith, La Mesa, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 329 days.

(21) Appl. No.: 16/285,074

(22) Filed: Feb. 25, 2019

(65) Prior Publication Data

US 2020/0274396 A1 Aug. 27, 2020

(51) Int. Cl.
  *H02J 50/12* (2016.01)
  *H02J 7/02* (2016.01)
  *G01R 27/26* (2006.01)
  *H01F 27/28* (2006.01)
  *H01F 38/14* (2006.01)

(52) U.S. Cl.
  CPC .......... *H02J 50/12* (2016.02); *G01R 27/2688* (2013.01); *H01F 27/28* (2013.01); *H01F 38/14* (2013.01); *H02J 7/025* (2013.01)

(58) Field of Classification Search
  CPC .... H02J 50/12; H02J 7/025; H02J 7/02; H02J 50/402; H02J 50/10; H02J 50/40; H02J 50/80; G01R 27/2688; G01R 31/40; H01F 27/28; H01F 38/14; H01F 27/38
  See application file for complete search history.

(56) References Cited

U.S. PATENT DOCUMENTS

| | | | | |
|---|---|---|---|---|
| 2010/0176934 A1* | 7/2010 | Chou | .................... | H02J 50/402 340/10.34 |
| 2013/0099734 A1* | 4/2013 | Lee | ......................... | H02J 50/80 320/108 |
| 2013/0127256 A1* | 5/2013 | Kim | ....................... | H02J 7/025 307/104 |
| 2013/0134792 A1* | 5/2013 | Bunsen | ................... | H02J 50/60 307/104 |
| 2015/0246614 A1* | 9/2015 | Dames | .................. | H02M 5/293 191/10 |
| 2016/0019766 A1* | 1/2016 | Padula | ............... | G08B 13/2477 340/572.1 |
| 2017/0324282 A1* | 11/2017 | You | ........................... | H02J 7/00 |

(Continued)

*Primary Examiner* — Jared Fureman
*Assistant Examiner* — Michael J Warmflash
(74) *Attorney, Agent, or Firm* — Haynes and Boone, LLP

(57) ABSTRACT

In accordance with embodiments of the present invention, a wireless power transmitter includes a transmit coil that includes a plurality of concentric coils; a switch circuit coupled to the plurality of concentric coils; a driver coupled to provide a voltage to the switch circuit; and a controller coupled to the switch circuit, the controller providing control signals to the switch circuit selecting to provide the voltage across one or more of the plurality of concentric coils depending on a Q-factor measuring in the presence of a receive coil. A method of operating a wireless power transmitter includes determining a measured Q-factor for each of a plurality of configurations of concentric transmit coils; determining a difference between each of the measured Q-factors and a standard Q-factor; and selecting one of the plurality of configurations based on the differences.

18 Claims, 4 Drawing Sheets

(56) References Cited

U.S. PATENT DOCUMENTS

| | | | |
|---|---|---|---|
| 2018/0006555 A1* | 1/2018 | Abu Qahouq | H02J 7/00712 |
| 2018/0205265 A1* | 7/2018 | Park | H02J 50/12 |
| 2019/0006873 A1* | 1/2019 | Aurongzeb | H01F 27/28 |
| 2019/0109499 A1* | 4/2019 | Smith | H02M 3/156 |
| 2019/0214852 A1* | 7/2019 | Park | H02J 7/02 |
| 2019/0334391 A1* | 10/2019 | Qi | H01F 38/14 |
| 2020/0328616 A1* | 10/2020 | Van Wageningen | H02J 50/60 |

* cited by examiner

Q-FACTOR DETERMINATION OF COIL SELECT

TECHNICAL FIELD

Embodiments of the present invention are related to wireless power systems and, specifically, to back-channel communications in a wireless power transmission system.

DISCUSSION OF RELATED ART

Mobile devices, for example smart phones, tablets, wearables and other devices are increasingly using wireless power charging systems. In general, wireless power transfer involves a transmitter driving a transmit coil and a receiver with a receiver coil placed proximate to the transmit coil. The receiver coil receives the wireless power generated by the transmit coil and uses that received power to drive a load, for example to provide power to a battery charger.

There are multiple different standards currently in use for the wireless transfer of power. The more common standards for wireless transmission of power include the Alliance for Wireless Power (A4WP) standard and the Wireless Power Consortium standard, the Qi Standard. Under the Wireless Power Consortium, the Qi specification, a resonant inductive coupling system is utilized to charge a single device at the resonance frequency of the receiver coil circuit. In the Qi standard, the receiving device coil is placed in close proximity with the transmission coil while in the A4WP standard, the receiving device coil is placed near the transmitting coil, potentially along with other receiving coils that belong to other charging devices.

Typically, a wireless power system includes a transmitter coil that is driven to produce a time-varying magnetic field and a receiver coil, which can be part of a device such as a cell phone, PDA, computer, or other device, that is positioned relative to the transmitter coil to receive the power transmitted in the time-varying magnetic field.

Therefore, there is a need to develop better coil technologies for use with wireless power systems and improve the sensing of objects placed above transmitter pads.

SUMMARY

In accordance with embodiments of the present invention, a wireless power transmitter includes a transmit coil that includes a plurality of concentric coils; a switch circuit coupled to the plurality of concentric coils; a driver coupled to provide a voltage to the switch circuit; and a controller coupled to the switch circuit, the controller providing control signals to the switch circuit selecting to provide the voltage across one or more of the plurality of concentric coils depending on a Q-factor measuring in the presence of a receive coil. A method of operating a wireless power transmitter includes determining a measured Q-factor for each of a plurality of configurations of concentric transmit coils; determining a difference between each of the measured Q-factors and a standard Q-factor; and selecting one of the plurality of configurations based on the differences.

These and other embodiments are further discussed below with respect to the following figures.

These figures are further discussed in detail below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

In accordance with embodiments of the present invention, a transmitter can include a plurality of transmit coil configurations and can determine which of the configurations to be used with respect to a particular receive coil of a wireless power receiver by monitoring the quality factor Q of the coupling between each of the transmit coil configurations and the receive coil. The Q-factor can be detected from the change in the impedance facing the TX coils due to the presence of the Rx device that has been placed above the Tx pad. The change in the Q factor of each of the transmit coils as the receive coil is placed proximate the transmit coil configurations determines which of the transmit coil configurations to use for transfer.

Figure 1:
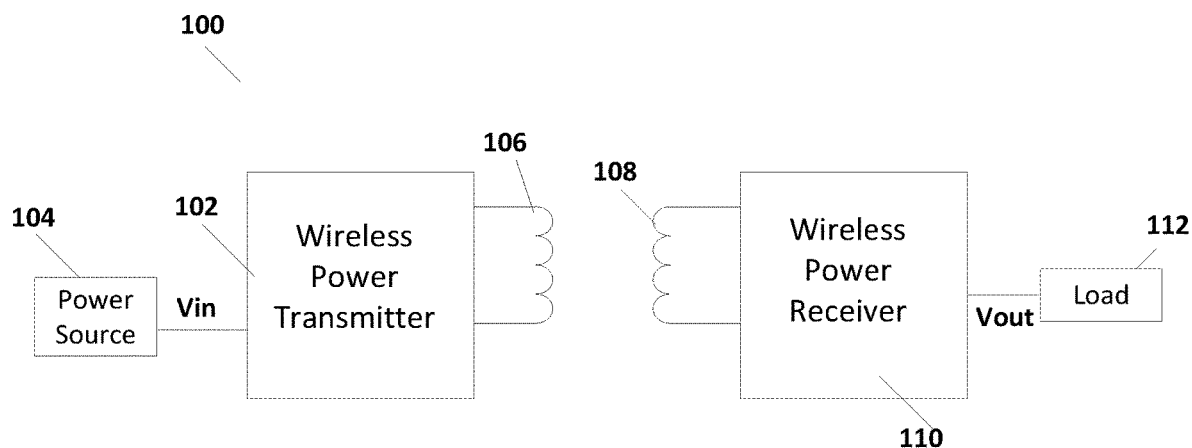
FIG. 1 illustrates a wireless power transmission system according to some embodiments of the present invention.

FIG. 1 illustrates a simplified wireless power system 100 according to some embodiments of the present invention. System 100 includes a wireless power transmitter 102 and a wireless power receiver 110. Wireless power transmitter 102 and wireless power receiver 110 are hosted in separate devices, for example a stationary charging station and a mobile device or two mobile devices. Wireless power transmitter 102 may be part of a stationary charging device while wireless power receiver 110 may be included in a mobile device.

As is illustrated in FIG. 1, devices may be provided that include a transmitter or a receiver. Transmit device 100 includes wireless power transmitter 102 and transmit coil 106. Receiver 110 includes wireless power receiver 110 and receive coil 108. However, in some embodiments, it is useful for a device to be capable of both transmitting wireless power and receiving wireless power, depending on circumstance, and therefore will include both a transmitter 102 and a receiver 110. In some embodiments, devices may include both a transmitter and a receiver, however in a given circumstance one device is transmitting and the other is receiving power.

As illustrated in FIG. 1, a wireless power transmitter 102 is coupled to receive power from a power source 104. Wireless power transmitter 102 drives a transmit coil 106 to produce a time-varying electromagnetic field at a particular frequency, which is also the switching frequency of the driver coupled to transmit coil 106. Receiver coil 108 of wireless power receiver 110 couples with the electromagnetic field generated by transmit coil 106 of wireless power transmitter 102 to receive the wireless power that is transmitted at the same particular frequency. As illustrated in FIG. 1, receiver coil 108 is coupled to a wireless power receiver 110 which receives power from receiver coil 108 and provides power to a load 112. Wireless power transmitter 102 may be configured to generate a time-varying electromagnetic field in the presence of wireless power receiver 110, which is configured to receive the wireless power transmitted by the wireless power transmitter 102. The elements of the wireless power transmitter 102 and wireless power receiver 110 may vary in size and shape to accommodate power requirements and physical location of wireless power system 100.

As discussed above, wireless power receiver 110 recovers the power from the time varying electromagnetic field and typically provides DC power input to load 112 of a device that includes wireless power receiver 110 and receive coil 108. Power is transferred when the device is proximate wireless power transmitter 102. In some cases, load 112 may include a battery charger and the device includes a battery.

Some manufacturers are developing transmitter coils that includes a plurality of concentric coils to provide efficient wireless power transfer between transmitter 102 and receiver 110 depending on the size of receive coil 108. As such, in accordance with some embodiments, transmit coil 106 includes a plurality of concentric coils that can be used to transmit power. Each of the concentric coils can be used with a receive coil 108 appropriate for various devices. For example, a receive coil 108 in a wearable device has a much smaller diameter than the receive coil 108 for a phone device or a tablet device. Consequently, since high-efficiency wireless transfer occurs with receive coil 108 having a larger diameter than transmit coil 106, transmit coil 106 can be configured to provide a coil appropriate for the particular receive coil 108. For example, in one configuration transmit coil 106 can include a wearable coil as the center coil. The wearable center coil is surrounded by a phone charging coil appropriate for use with a smart phone. The phone coil, in turn, can be surrounded by an even larger diameter tablet coil. In some embodiments, these coils are concentric within each other. In some embodiments, the coils can be combined such that the transmit coil diameter is larger for larger receive devices with larger diameter receive coils 108. Each successively larger RX unit (watch, phone, tablet) will also include metals inherent in the design. These metals will also be detectable by the Tx coils in the Q-factor test. With information from each coil, the size of the currently placed Rx can be determined with reasonable assurance.

Figure 2A:
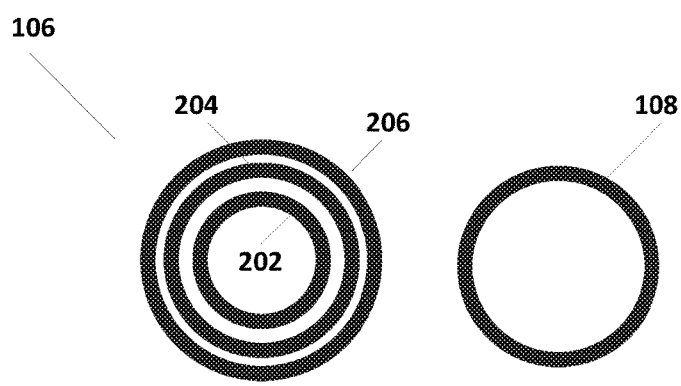
FIGS. 2A, 2B, and 2C illustrate a planar view of transmit coils according to some embodiments in relation to various receive coils.
Figure 2B:
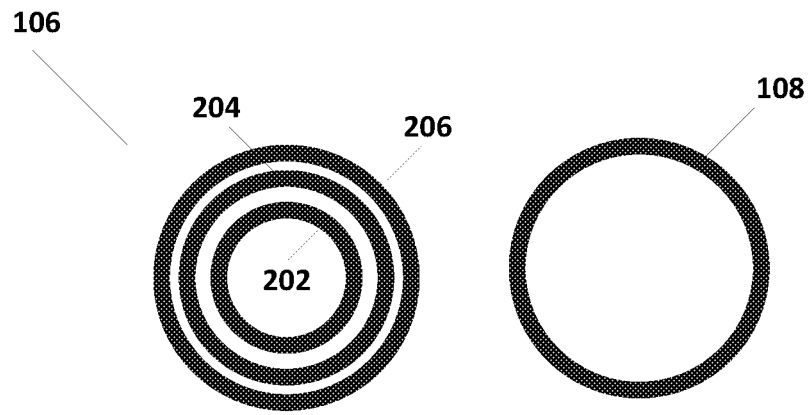
Figure 2C:
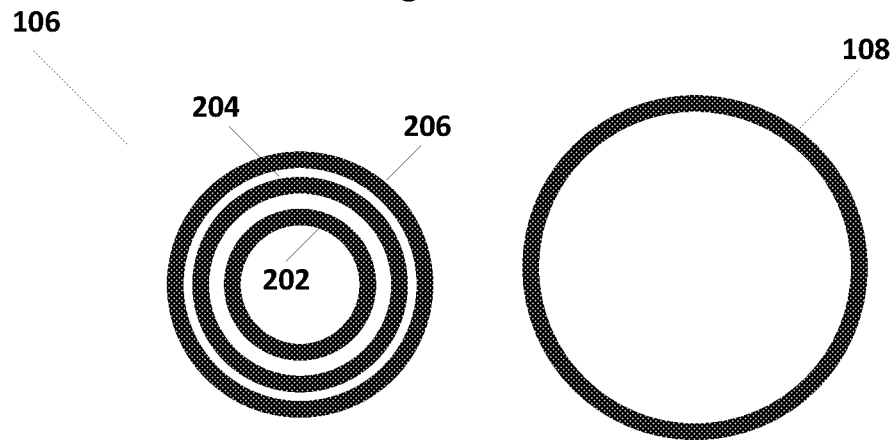

FIGS. 2A, 2B, and 2C illustrate such an arrangement according to some embodiments. As illustrated in FIG. 2A, transmit coil 106 includes a plurality of concentric coils, coil 202, coil 204, and 206. Coil 202 has the smallest diameter, coil 206 has the largest diameter, and coil 204 has an intermediate diameter between that of coil 202 and 206. Embodiments of the present invention can include any number of concentric coils greater than 2. Three coils, coil 202, coil 204, and coil 206, are illustrated here for ease of explanation. For example, as discussed above, coil 202 may be a wearable transmit coil, coil 204 may be a phone transmit coil, and coil 206 may be a table transmit coil. In some embodiments, coil 202, coil 204, and coil 206 may be completely separated coils. In some embodiments, coil 202, 204, and 206 may be coupled to be used in together.

FIG. 2A illustrates operation of transmit coil 106 in proximity to a receive coil 108 that has a diameter larger than that of coil 202 but smaller than that of coils 204 and 206. In this case, efficient transmission of power occurs by powering coil 202 and not powering coils 204 and 206. In this case, receive coil 108 may represent the receive coil of a wearable device, and coil 202 may be called the wearable transmit coil.

FIG. 2B illustrates operation of transmit coil 106 in proximity to a receive coil 108 that has a diameter larger than that of coil 204 and smaller than the of coil 206. In this case, efficient transmission of power occurs by powering coil 204 and not powering coil 206 or coil 202. In some embodiments, coils 202 and 204 may be coupled in series and both powered to provide magnetic flux through receive coil 108. In this case, receive coil 108 may represent a phone receive coil of a mobile phone, and coil 204 may be called the phone transmit coil.

FIG. 2C illustrates operation of transmit coil 106 in proximity to a receive coil 108 that has a diameter larger than that of coil 206. In this case, efficient transmission of power occurs by powering coil 206 and not powering coil 204 and 202. In some cases, coils 202, 204, and 206 may be coupled in series and powered to provide magnetic flux through receive coil 108. In this case, receive coil 108 may represent a tablet receive coil of a tablet, and coil 206 may be called the table transmit coil.

The quality factor Q between each of coils 202, 204, and 206 can be determined as receive coil 108 is brought into proximity with transmit coil 106. Consequently, as is discussed below, the change in Q between the coils, in comparison with the Q as measured in the absence of a foreign object, can be used to determine which of the coil configurations to power for transfer of wireless power.

Figure 3A:
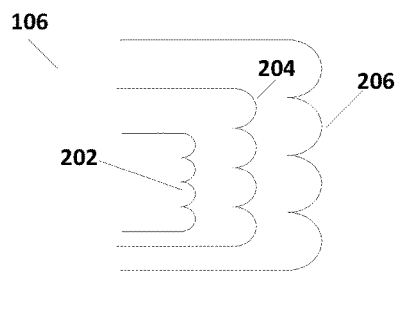
FIGS. 3A and 3B illustrate example transmit coil configurations according to some embodiments.
Figure 3B:
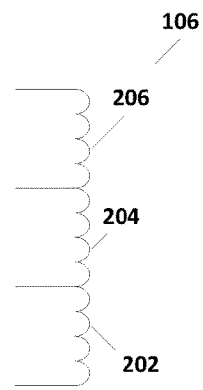

FIGS. 3A and 3B illustrate example coil configurations that can form transmit coil 106. As illustrated in FIGS. 2A, 2B, and 2C, coils 202, 204, and 206 are concentric coils. As shown in FIG. 3A, each of coils 202, 204, and 206 are completely separated and powered separately. As shown in FIG. 3B, coils 202, 204, and 206 may be series coupled. Each of coils 202, 204, and 206 may be powered separately or in series combinations. However, in some embodiments, coils 202, 204, and 206 may be powered simultaneously as well such that coil 202 may be powered, coils 202 and 204 may be powered together, or coils 202, 204, and 206 may be powered together, depending on circumstance.

In current systems, multi-coil designs do not include overlapping coils, each of the coils are separated and are not concentric, and signal strength can easily be used to determine which coil the Rx device was placed upon. With coils that are concentrically placed as illustrated in FIGS. 2A, 2B, and 2C, each one inside or surrounding the other, signal strength cannot be used reliably to determine the coil that should be used to charge the receive device. Further, it takes too long to connect (e.g., with in-band communication) and use an identification process or configuration process to decide what device was placed on transmit coil 106 and then switch coils over to the correct coil or coil configuration if the incorrect transmit coil was initially used. Consequently, embodiments of the present invention detect the character of the device that includes receiver 110, and in particular the character of receive coil 108, to determine which of the multiple coil configurations in transmit coil 106 to power for the wireless power transfer. This determination may be accomplished before starting and PING procedure and connecting to the receiver 110.

Figure 4:
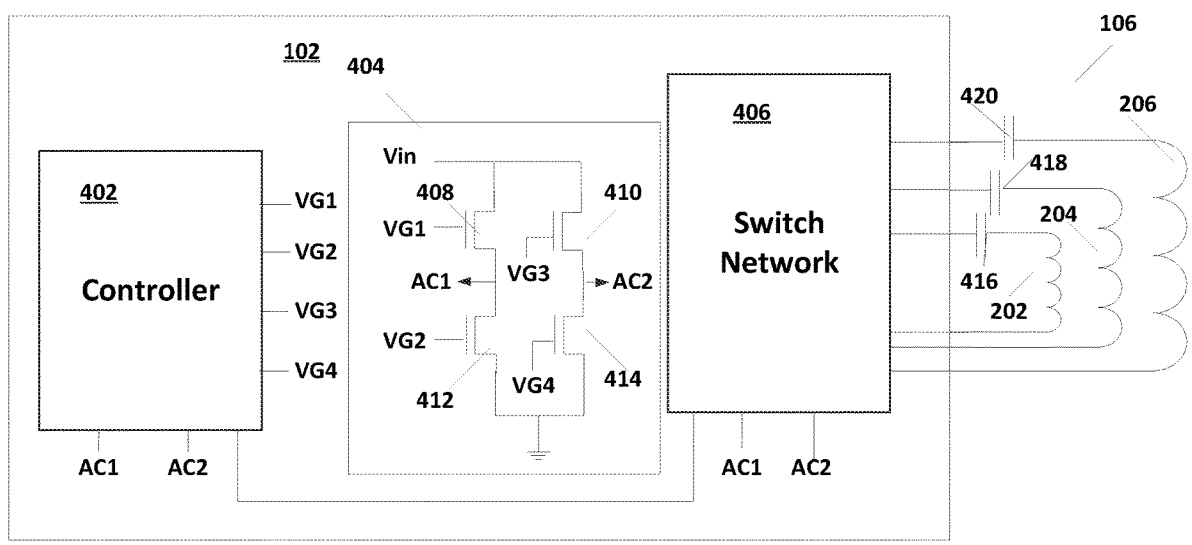
FIG. 4 illustrates a transmitter according to some embodiments of the present invention.

FIG. 4 illustrates an example of a transmitter 102 coupled to the configuration of transmit coil 106 illustrated in FIG. 3A. As illustrated in FIG. 4, transmitter 102 includes a controller 402, a driver 404, and a switching network 406. Controller 402 can be microcontroller or other processor-based controller. Controller 402 can include, for example, a processor, volatile and non-volatile memory, and all supporting circuitry to receive data, execute instructions, and provide control signals. As illustrated in FIG. 4, controller 402 receives two signals AC1 and AC2 from driver 404 and provides control signals to driver 404, in this case VG1, VG2, VG3, and VG4, and control signals to switch network 406. Controller 402 may further include analog-to-digital converters to receive and digitize voltages AC1 and AC2.

Driver 404 receives control signals, in this example VG1, VG2, VG3, and VG4, and provides an AC voltage for driving transmit coil 106. In the particular example illustrated in FIG. 4, driver 404 is a full-bridge DC to AC inverter having transistors 408 and 412 couple in series between input voltage Vin and ground and transistors 410 and 414 coupled in series between input voltage Vin and Ground. Transistors 408, 412, 410, and 414 are driven by gate voltages VG1, VG2, VGT3, and VG4, respectively, to provide an AC voltage between nodes AC1 and AC2. The voltages AC1 and AC2 are input to controller 402, and is applied to switching network 406 to driver transmit coil 106. In some embodiments, driver 404 may be a half-bridge inverter. In the half-bridge configuration, for example, transistors 408 and 412 are not present and AC1 may be ground. AC2 is then switched between Vin and Ground in transistors 410 and 414.

Switching network 406 receives the voltages AC1 and AC2 and control signals from controller 402. In accordance with the control signals, switching network 406 couples one of the configurations of coils 106 to receive the voltages AC1 and AC2 in order to drive that configuration. In some embodiments, the unused coil configurations may be disabled, e.g. grounded or left floating and not connected to power driving signals, in order to not interfere with the transmission of power from the activated coil configuration.

As is further illustrated in FIG. 4, coils 202, 204, and 206 are coupled in series with capacitors 416, 418, and 420, respectively, so that each configuration forms a resonant tank circuit. In some embodiments, capacitors 416, 418, and 420 are separate capacitors matched with coils 202, 204, and 206, respectively. In some embodiments, the configurations share one or more capacitors controlled by switching network 406 to form individual tank circuits.

A Q measurement can be performed by controller 402 and is an indirect reflection of the size of an object placed over transmit coil 106. The Q-factor can be determined, for example, by monitoring the voltage between AC1 and AC2 and the current through each coil configuration in transmit coil 106. The Q-factor measurement can be used to determine the physical size of the object. The Q-factor reflected at the transmit LC tank circuit formed by each configuration of coils in transmit coil 106 by the newly placed Rx device receive coil 108 can be determined. A Q-factor calibration can be obtained with no objects (including receive coil 108) placed proximate to transmit coil 106 and the results saved to non-volatile memory in controller 402. The Q-factor measurements can then be performed and compared with the saved Q-factor measurements to determine the size of the object quickly detect the appropriate coil to select and use for charging.

Figure 5:
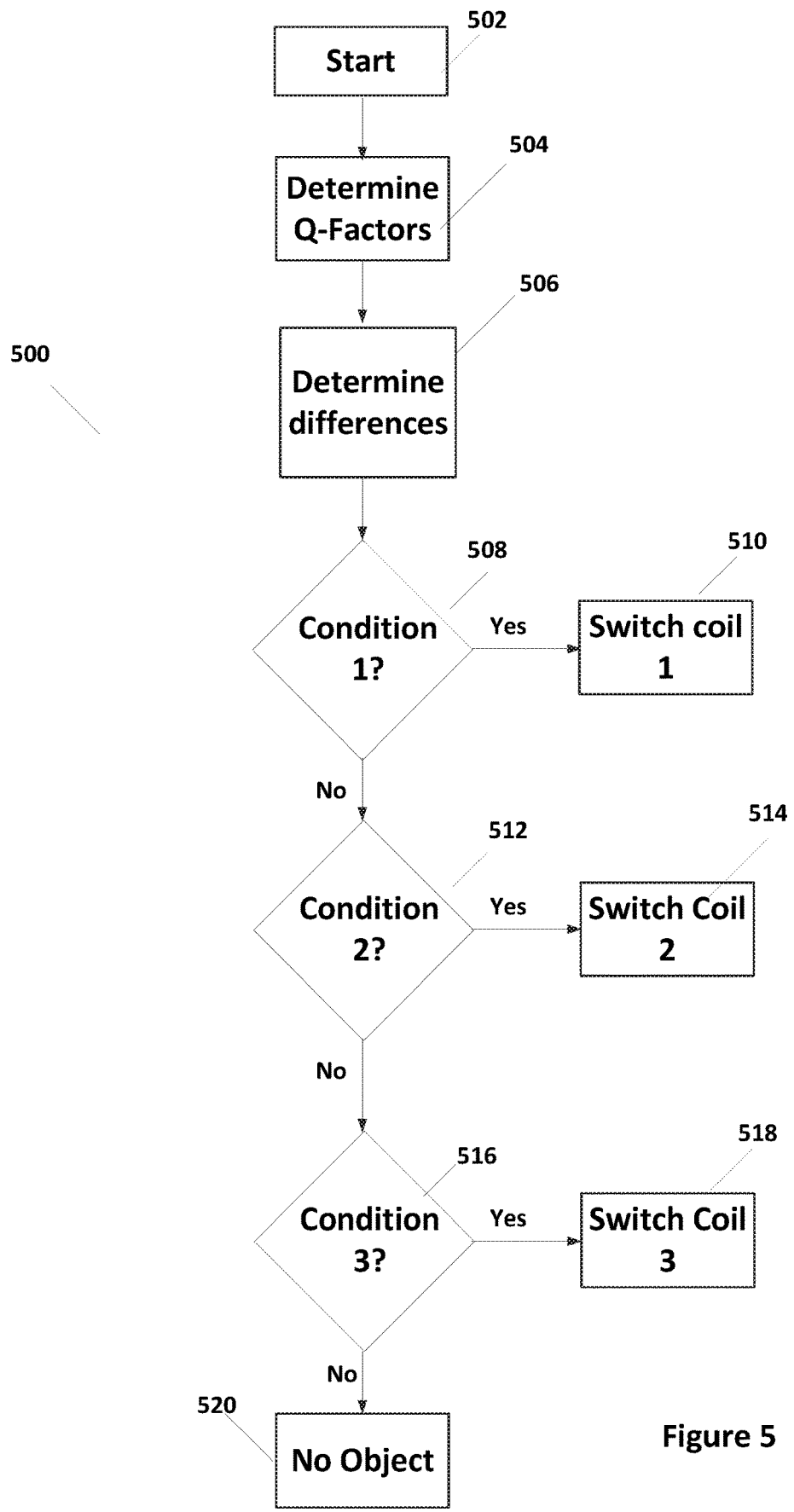
FIG. 5 illustrate an algorithm that can be executed in a transmitter such as that illustrated in FIG. 4 according to some embodiments of the present invention.

FIG. 5 illustrates an algorithm 500 for determining which coil configuration to use when a transmit coil 108 is placed proximate the transmission coil 106. As illustrated in FIG. 5, algorithm 500 begins at start 502, where presence of a receive coil 108 proximate to transmit coil 106 is detected. In step 504, the Q-factor for each coil configuration in transmission coil 106 is determined. For example, in transmission coil 106 as illustrated in FIG. 3A, the Q-factor for each of coils 202, 204, and 206 in combination with the corresponding capacitors is determined in controller 402 by monitoring the voltages AC1 and AC2 as well as the current through each of coils 202, 204, and 206.

For convenience, in the presence of receive coil 108 the Q-factor of coil 202 can be designated QM1, the Q-factor of coil 204 can be QM2, the Q-factor of coil 206 can be QM3. The standard Q-factors measured without the presence of a foreign object, which are stored in non-volatile memory of controller 402 during initial qualification of transmitter 102, can be designated as QS1 for coil 202, QS2 for coil 204, and QS3 for coil 206.

In step 506, the Q-factors determined are compared with the stored Q-factors in the absence of a foreign object and to each measurement collected by the transmit coils while the transmitter measures Q with an RX unit placed to allow the transmitter to interpret the size of the receiver currently placed. Consequently, a Q-factor difference for each coil configuration is determined. For coil 202 Q1=QS1−QM1, for coil 204 Q2=QS2−QM2, and for coil 206 Q3=QS3−QM3. Based on Q1, Q2, and Q3, the coil configuration (coil 204, coil 206, or coil 206) to power is determined.

Using these calculated differences in Q—Q1, Q2, and Q3—a determination of which coil configuration of transmit coil 106 should be used to transmit power to receiver coil 108. In step 508, if Q1 represents a large change, Q2 represents a low to medium change, and Q3 represents a low change, then algorithm 500 proceeds to step 510 where coil 202 is powered. For example, if a watch is placed over transmitter coil 106, then the center coil (the watch coil) will have a large negative change in the coil, the middle coil (the phone coil) can have a medium negative change in the Q-factor, and the outer coil (the tablet coil) can have a low change in the Q-factor. Under that circumstance, the watch is identified by this process and the watch coil is powered. If the condition that Q1 is high, Q2 is medium or low, and Q3 is low is not met, then algorithm 500 proceeds to step 512.

In step 512, if Q1 represents a large change, Q2 represents a large change, and Q3 represents a medium or low change, then algorithm 500 proceeds to step 514 where coil 204 is activated. In some cases, both coils 202 and 204 can be activated. In a particular example, target 108 can be a phone. In that case, watch coil 202 detects a high Q-factor change, the phone col 204 represents a high Q-factor change, and table coil 206 detects a medium to low Q-factor change. In this case, the phone coil 204 is used for wireless power transfer. If this condition is not met, then algorithm 500 proceeds to step 516.

In step 516, if Q1 represents a large change, Q2 represents a large change, and Q3 represents a large change, then algorithm 500 proceeds to step 518 where coil 206 is activated. In some embodiments, all of coils 202, 204, and 206 are activated. In a particular example, target 108 can be a tablet. In that case, as discussed above, watch coil 202 exhibits a high Q-factor change, phone coil 204 exhibits a high Q-factor change, and table coil 206 exhibits a high Q-factor change. In that case, the tablet coil is selected for use in transmission.

If algorithm 500 reaches step 520, then none of the conditions apply. Algorithm 500 concludes that there is no receive coil 108 and exits. In the event that the Q-factor detection concludes a certain type of receiver, but the transmitter later determines the selection was incorrect, then the transmitter can be configured to alter its decision based on the wireless power characteristics obtained by communication with the currently placed receiver. The transmitter can determine that the original selection is incorrect, for example, based on the identification reported by the receiver or based on the power requirement not being met. For example, if too much power is sent, the transmitter may switch to the next smaller coil if available. If not enough power is being sent, then the next larger coil may be selected.

The above detailed description is provided to illustrate specific embodiments of the present invention and is not intended to be limiting. Numerous variations and modifications within the scope of the present invention are possible. The present invention is set forth in the following claims.

What is claimed is:

1. A wireless power transmitter, comprising:
 a transmit coil that includes a plurality of concentric coils;
 a switch circuit coupled to the plurality of concentric coils;
 a driver coupled to provide a voltage to the switch circuit; and
 a controller coupled to the switch circuit, the controller configured to execute instructions to measure a Q-factor for each of the plurality of concentric coils in the presence of a receive coil, determine differences between standard Q-factors for each of the plurality of concentric coils and the measured Q-factor for each of the plurality of concentric coils, determine a coil configuration based on the differences such that the coil configuration includes one of the plurality of concentric coils that has a size less than that of the receive coil and provide control signals to the switch circuit selecting to provide the voltage across one or more of the plurality of concentric coils depending on the coil configuration.

2. The transmitter of claim 1, wherein each of the plurality of concentric coils is an independent coil.

3. The transmitter of claim 1, wherein the plurality of concentric coils is coupled in series.

4. The transmitter of claim 1, wherein the plurality of concentric coils includes an inner coil, a middle coil, and an outer coil.

5. The transmitter of claim 4, wherein the differences include an inner coil difference, a middle coil difference, and an outer coil difference and the controller determines the configuration of the plurality of concentric coils to use according to a first condition, a second condition, and a third condition such that the configuration is the inner coil when the first condition is met, the middle coil when the second configuration is met, and the outer coil when the third condition is met.

6. The transmitter of claim 4, wherein the difference include an inner coil difference, a middle coil difference, and an outer coil difference and the controller determines which of the plurality of concentric coils to use by
 selecting the inner coil when the inner coil difference is high, the middle coil difference is low or medium, and the outer coil difference is low;
 selecting a series combination of the middle coil and the inner coil when the inner coil difference is high, the middle coil difference is high, and the outer coil difference is low or medium; and
 selecting a series combination of the outer coil, the middle coil, and the inner coil when the inner coil difference is high, the middle coil difference is high, and the outer coil difference is high.

7. The transmitter of claim 4, wherein the inner coil has a diameter appropriate to transfer power to the receive coil of a wearable device, the middle coil has a diameter appropriate to transfer power to the receive coil of a phone, and the outer coil has a diameter appropriate to transfer power to the receive coil of a tablet.

8. A method of operating a wireless power transmitter, comprising:
 determining a measured Q-factor for each of a plurality of concentric transmit coils in the presence of a receive coil;
 determining a difference between each of the measured Q-factors and a standard Q-factor for each of the plurality of concentric transmit coils;
 selecting one of the plurality of configurations based on the differences for each of the plurality of concentric transmit coils such that the coil configuration includes one of the plurality of concentric coils that has a size less than that of the receiver coil; and
 providing wireless power using the selected configuration to the receive coil.

9. The method of claim 8, wherein the plurality of configurations of concentric transmit coils includes a plurality of independently driven concentric coils.

10. The method of claim 8, wherein the plurality of configurations of concentric transmit coils includes one or more series coupled combinations of a plurality of concentric coils.

11. The method of claim 8, wherein the plurality of concentric coils includes an inner coil, a middle coil, and an outer coil.

12. The method of claim 11, wherein the differences include an inner coil difference, a middle coil difference, and an outer coil difference and wherein selecting one of the plurality of configurations includes
 selecting the inner coil when a first condition of the inner coil difference, the middle coil difference, and the outer coil difference is determined;
 selecting the middle coil when a second condition of the inner coil difference, the middle coil difference, and the outer coil difference is determined; and
 selecting the outer coil when a third condition of the inner coil difference, the middle coil difference, and the outer coil difference is determined.

13. The method of claim 11, wherein the difference includes an inner coil difference, a middle coil difference, and an outer coil difference and wherein selecting one of the plurality of configurations includes
 selecting the inner coil when the inner coil difference is high, the middle coil difference is low or medium, and the outer coil difference is low;
 selecting a series combination of the middle coil and the inner coil when the inner coil difference is high, the middle coil difference is high, and the outer coil difference is low or medium; and selecting a series combination of the outer coil, the middle coil, and the inner coil when the inner coil difference is high, the middle coil difference is high, and the outer coil difference is high.

14. The method of claim 11, wherein the inner coil has a diameter appropriate to transfer power to the receive coil of a wearable device, the middle coil has a diameter appropriate to transfer power to the receive coil of a phone, and the outer coil has a diameter appropriate to transfer power to the receive coil of a tablet.

15. The method of claim 8, further including
determining whether the one of the plurality of configurations is not appropriate; and
selecting a different configuration of the plurality of configurations if the one of the plurality of configurations is not appropriate.

16. The method of claim 15, wherein determining includes receiving an actual identification inconsistent with the one of the plurality of configurations.

17. The method of claim 15, wherein determining that the one of the plurality of configurations is not appropriate when power requirements of a receiver cannot be met.

18. The method of claim 17, wherein the different configuration includes a next size coil if the power requirements of the receiver cannot be met with the one of the plurality of configurations.

\* \* \* \* \*